(12) United States Patent
Scheytt

(10) Patent No.: US 8,477,054 B2
(45) Date of Patent: Jul. 2, 2013

(54) METHOD AND DEVICE FOR PHASE AND/OR PULSE-WIDTH MODULATION

(75) Inventor: Johann Christoph Scheytt, Frankfurt (DE)

(73) Assignee: IHP GmbH, Frankfurt (DE)

( * ) Notice: Subject to any disclaimer, the term of this patent is extended or adjusted under 35 U.S.C. 154(b) by 91 days.

(21) Appl. No.: 13/134,630

(22) Filed: Jun. 10, 2011

(65) Prior Publication Data
US 2011/0316731 A1    Dec. 29, 2011

(30) Foreign Application Priority Data

Jun. 14, 2010  (DE) .......................... 10 2010 030 031
Jan. 14, 2011  (EP) ..................................... 11151009

(51) Int. Cl.
*H03M 3/00* (2006.01)

(52) U.S. Cl.
USPC ......................................... 341/143; 341/155

(58) Field of Classification Search
USPC ................... 341/143, 155, 166; 375/371, 376, 375/229, 238
See application file for complete search history.

(56) References Cited

U.S. PATENT DOCUMENTS

| 7,002,425 | B2 | 2/2006 | Maunuksela |
| 7,363,219 | B2 * | 4/2008 | Stachurski .................... 704/223 |
| 7,433,439 | B1 * | 10/2008 | Richmond .................... 375/371 |
| 7,554,373 | B2 | 6/2009 | Fujino et al. |
| 7,817,767 | B2 * | 10/2010 | Tell et al. ....................... 375/376 |
| 2005/0270006 | A1 | 12/2005 | Chapuis |
| 2006/0001467 | A1 | 1/2006 | Fujino et al. |

OTHER PUBLICATIONS

J. Keyzer et al.; "Generation of RF Pulsewidth Modulated Microwave Signals Using Delta-Sigma Modulation"; IEEE MTT-S Digest; 2002; pp. 397-400; Internet 0/7803/7239-5/02.

Frederick H. Raab; "Radio Frequency Pulsewidth Modulation"; IEEE Transactions on Communications; Aug. 1973; pp. 958-966; IEEE.

* cited by examiner

*Primary Examiner* — Peguy Jean Pierre
(74) *Attorney, Agent, or Firm* — Ware, Fressola, Maguire & Barber LLP

(57) ABSTRACT

The present invention relates to a device (2000) and a method for encoding an input signal (102) into a digital pulse-width and/or phase modulated output signal (162). The present invention also relates to a transmission method, a power amplifier and a transmitter. With the aid of a mapping process comprising at least three-stages, a sequence of output pulses (162) is generated which corresponds on average over time to a theoretical, previously computed target pulse. In this way, the device (2000) or the method can be digitally implemented and a large part (100, 110) of the device (2000) can also be operated at a clock rate that is substantially lower than a clock rate of the output signal generator (200, 220).

14 Claims, 8 Drawing Sheets

METHOD AND DEVICE FOR PHASE AND/OR PULSE-WIDTH MODULATION

CROSS REFERENCE TO RELATED APPLICATION

Reference is made to and priority claimed from German Patent Application Serial No. DE 10 2010 30 031.4 filed Jun. 14, 2010, entitled VERFAHREN UND VORRICHTUNG ZUR PHASEN-UND/ODER PULSWEITENMODULATION, and European Patent Application Serial No. EP 1151009.5 filed Jan. 14, 2011, entitled VERFAHREN UND VORRICHTUNG ZUR PHASEN-UND/ODER PULSWEITENMODULATION.

BACKGROUND OF THE INVENTION

1. Technical Field

The invention relates firstly to a digital modulation method which realizes phase modulation or pulse-width modulation or a combination of phase and pulse-width modulation. A digital modulation device suitable for implementing the modulation method is also proposed. The method and the device are suitable in particular for high-frequency (HF) applications. The present invention also relates to a power amplifier, a transmission device and a transmission method.

2. The Prior Art

A modulation method is used to encode a signal for the purpose of wired or wireless transmission. Methods of this kind are essentially known.

For example, FIG. 1 shows a prior art HF Class-D power amplifier. An HF signal modulated in amplitude and phase is fed to the input of a pulse width modulator that encodes the signal into a pulse-width and phase modulated signal (PWM signal). The downstream power amplifier amplifies the PWM signal. Due to the binary signal waveform, the power amplifier may be designed as a nonlinear circuit amplifier, which typically has a high level of energy efficiency. At the output of the power amplifier, the amplified PWM signal is bandpass filtered, as a result of which harmonic frequency components are suppressed, and only the amplified modulated HF signal is sent to the antenna.

FIG. 2 shows a typical implementation of a prior art pulse width modulator. A ramp generator generates a periodic voltage $V_{ref}(t)$ with a triangle waveform. The amplitude and phase modulated HF signal and $V_{ref}$ are fed to a fast comparator. By comparing the ramp with the HF signal, a pulse-width and phase modulated signal is generated.

The pulse width modulator according to FIG. 2 has the advantage of simple implementation. However, it has various serious disadvantages. The first is that the linearity of the modulator, i.e., the accuracy with which the phase and amplitude of the HF signal is converted into the PWM signal, is dependent on the accuracy of the ramp. In the GHz range, it is almost impossible to generate a highly accurate linear ramp. More particularly, the "peaks" of the triangular waveform signal are truncated to a greater or lesser degree due to the finite bandwidth of the electronic components, with the result that the waveform acquires a more sinusoidal than triangular shape, the greater the frequency. This results in nonlinear distortion of phase and amplitude in the modulator. The comparator also switches more or less quickly depending on previous switching operations, because at higher switching frequencies the internal current/voltage compensating actions of the comparator have not fully subsided. Due to these characteristics of the comparator, the PWM signal has additional timing fluctuations (jitter), which can be interpreted as phase and amplitude noise.

Another disadvantage of the pulse-width modulator in FIG. 2 is that very small and very large pulse widths produced by the modulator may cause the power amplifier to not switch on fully, thus leading to nonlinear distortion of phase and amplitude. Yet another disadvantage of this modulator is that phase and amplitude cannot be modulated independently of each other, so it is not possible to compensate separately for amplitude- or phase-specific distortion. Another disadvantage of the modulator is that it is an analog circuit which is greatly affected by fluctuations in processing, voltage and temperature. A further disadvantage is that an HF signal is needed on the input side.

In Frederick H. Raab: "Radio Frequency Pulse Width Modulation", Transactions on Communications, August 1973, pp. 958-959, a ramp generator is described in which the reference voltage $V_{ref}$ is produced by rectifying the modulated HF signal. At high frequencies in the GHz range, generating the reference signal $V_{ref}(t)$ with a high degree of accuracy becomes difficult in this case as well. More specifically, the rectified signal has a triangular waveform close to the zero crossover, said waveform being rounded and hence distorted by the limited bandwidth of the electronic circuit.

A method and a circuit for pulse-width modulation are known from the publication by J. Keyzer et al.: "Generation of RF Pulsewidth Modulated Microwave Signals Using Delta-Sigma Modulation", 2002, IEEE MTT-S Digest, pages 397-400, where two delta sigma modulators are used for pulse width modulation, instead of a simple comparator such as the one shown in FIG. 2. A signal to be encoded is represented therein by a phase signal component and an amplitude signal component. The phase signal component is fed to a first delta sigma modulator and the amplitude signal component is fed to a second delta sigma modulator. The output signal of the first delta sigma modulator and an output signal from a pulse generator control a "digital pulse delay modulator". The output signal from the latter is fed along with the output signal from the second delta sigma modulator to a digital pulse width modulator which generates the pulse-width and amplitude modulated output signal. In the method known from this publication, the phase is modulated first and then the amplitude, i.e. the pulse width of a pulse in the output signal. As a result, the circuit known from this publication is complex in that at least two delta sigma modulators are used and because both the pulse delay modulator and the pulse width modulator must operate at around the frequency of the output signal. Another aspect is that the output signal from such a pulse delay modulator and such a pulse width modulator contains distortions in the case of analog implementation in the high-frequency range.

SUMMARY OF THE INVENTION

The object of the present invention is to propose an improved device and an improved method for encoding an input signal into a digital pulse-width and/or phase modulated output signal, which is suitable for high-frequency applications and which can be realized or performed, respectively, at relatively little expense.

According to a first aspect of the present invention, the object is achieved by a device for encoding an input signal into a digital pulse width and/or phase modulated output signal, referred to in the following as a digital output signal, said device comprising the following components:

an input for receiving the input signal and an output for outputting the digital output signal, a phase encoder configured to derive a binary first start phase word and a binary first terminal phase word with a first resolution from the input signal, wherein the first start phase word determines a starting time within a period, at which a rising edge of a target pulse is to occur in the digital output signal, and the first terminal phase word determines a termination point within the period, at which a falling edge of the target pulse is to occur in the digital output signal, a phase interpolator connected downstream from the phase encoder and configured to convert the first start phase word into a plurality of second binary start phase words and the first terminal phase word into a plurality of second binary terminal phase words, with a second resolution that is smaller than the first resolution, wherein a respective second start phase word describes one of N possible discrete times in the period and thus approximately determines the starting time with the second resolution, and a respective second terminal phase word describes one of the N possible discrete times in the period and thus approximately determines the termination point with the second resolution, and an output signal generator configured to convert the plurality of second start phase words and the plurality of second terminal phase words into a serial sequence of output pulses and to output these as an output signal via the output, the serial sequence of output pulses corresponding on average over time to the target pulse.

The device according to the invention has the advantage that it can be realized almost entirely with digital circuit components. No analog equipment, such as mixers, ramp generators or other unclocked components are used, thus avoiding any of the disadvantages that such components usually involve. The device is therefore simpler in structure as well as being safer and more reliable in operation than prior art devices. More particularly, the device is resistant against variations in "PVT" values. PVT stands for "process-voltage-temperature", "process" values meaning technology-related parameters such as a component dimension or the purity of a material, "voltage" being a supply voltage, for example, and "temperature" being an operating or an ambient temperature, for example. The phase encoder, the phase interpolator and the output signal generator may each be clocked with quartz precision.

The device has the further advantage that only the output signal generator needs to be operated with a high output signal generator clock rate necessary for the digital output signal. The phase encoder and phase interpolator connected upstream from the output signal generator, in contrast, may be operated at a substantially lower phase encoder and phase interpolator clock rate, respectively, the ratio of these clock rates to the clock rate of the output signal generator being substantially determined by the contribution made by the plurality of second start phase words and second terminal phase words, as will be explained in further detail below. The contribution of the plurality is around M=20, for example, and the clock rate of the output signal generator is around 2 GHz. The phase encoder and the phase interpolator may each then be operated at 100 MHz, for example. Due to the relatively low phase encoder and phase interpolator clock rate, the phase encoder and the phase interpolator each have a relatively low energy consumption, which is basically a positive aspect. Cooling devices for the device, which essentially are relatively expensive, heavy and voluminous, may have small dimensions due to the low energy consumption, for example.

Another advantage of the device is that it is suitable for many different frequency ranges, for example for many different transmission frequencies. The same device may therefore be used for different radio standards, or a plurality of different radio bands may be served with one and the same device. At the most, a filter frequency of a reconstruction filter which can be optionally connected downstream from the output signal generator needs to be adjusted.

Another advantage of the device is that the input signal does not necessarily have to be an HF signal to be encoded, but need only be a digital baseband signal corresponding thereto and representing an amplitude and/or a phase.

The device according to the invention is configured to encode the input signal into the digital output signal in at least three steps, the first step being to map the input signal to a high-resolution first start phase word and a high-resolution first terminal phase word, the second step being to map these two words to the plurality of second, lower-resolution start phase words and terminal phase words. The third step is the physical conversion of the plurality of second start and terminal phase words into the serial sequence of pulses forming the digital output signal. This mapping process does not involve any loss of information. Rather, the first phase words having a first length are mapped without loss of information to M second phase words having a second length, the second phase words being passed, preferably sequentially, to the output signal generator.

The device according to the invention realizes phase modulation or pulse width modulation or a combination of phase and pulse width modulation. The device is configured accordingly to modulate phase and amplitude independently of each other. It is therefore possible to compensate separately for any amplitude-specific or phase-specific distortion in a power amplifier which can be optionally connected downstream from the output signal generator.

The frequency of the input signal is 5 MHz, for example. It may match a baseband data rate. The clock rate of the phase encoder may be identical to the frequency of the input signal and be 5 MHz. In this example, the length of the encoding period is therefore 200 ns. The first resolution with which the phase encoder performs derivation is 12 bits, for example. The clock rate of the phase interpolator is between 5 MHz and 2 GHz, for example, and the second resolution with which the phase interpolator performs conversion is 4 bits, for example. The clock rate with which the output signal generator performs conversion is 2 GHz, for example. The plurality of second start phase words and the plurality of second terminal phase words result, for example, from the ratio between the clock rates of the phase encoder and the output signal generator, so there are 400 of each, for example (2 GHz divided by 5 MHz). The frequency of the output signal may be identical to the clock rate of the output signal generator, and may therefore be 2 GHz. The values specified in the foregoing are applicable, for example, when the device according to the invention is used in the UMTS field.

In the description of the present invention, the expression "input signal" means the input signal to be encoded into the digital output signal. Accordingly, reference will also be made to an "input signal to be encoded". As will be explained in more detail further below, the input signal to be encoded may also be present as a baseband signal representing an amplitude and/or a phase, i.e., merely the modulation content without a carrier signal. Accordingly, reference will also be made to a "baseband signal" instead of an "input signal".

The digital output signal is a sequence of output pulses which are each modulated in their phase and/or in their pulse width. Hence, the output signal has either the value of a logical zero or a logical one at a given point in time.

The phase encoder is configured to derive the first start phase word and the first terminal phase word with the first resolution from the input signal. In the description of the present invention, the expression "resolution" means the precision of a time reference. For example, the phase encoder determines the starting time of the target pulse with a first start phase word that is eight bits wide. In this example, therefore, the first resolution is a=8 bits. This means it is possible to determine a total of A=256 points in time within the period. Thus, the first start phase word and the first terminal phase word can each be understood as a numerical value.

In the description of the present invention, the expression "encoding period" means a periodically recurrent length of time in which a target pulse is present. The phase encoder is configured to map information contained in the input signal, such as the present amplitude and/or the present phase position, by defining the position and the pulse width of the target pulse in the encoding period.

The phase encoder may contain a memory in the form of a lookup table, for example, in which all the information which may be represented in a clock period of the input signal is already allocated in the table to first start phase words and to first terminal phase words. Alternatively, the phase encoder may also operate on the basis of equations, and have a smaller processing unit.

The target pulse thus has a specific target phase position and/or a specific target pulse width. Both the target phase position and the target pulse width are defined by the starting time and the termination point.

The second resolution is lower than the first resolution and is n=6 bits, for example. Within the meaning of the above description, a respective one of the plurality of second start phase words and a respective one of the plurality of second terminal phase words then describe one of N=64 time points during the encoding period and may likewise be understood to be numerical values. The numerical value of the first start phase word is 9.5, for example. In that case, a numerical value of a second start phase word may then be 9, and the numerical value of another second start phase word 10.

The phase interpolator is configured to generate the plurality of second start phase words and the plurality of second terminal phase words in such a way that these are suitable for interpolating the starting time and the termination point, respectively. Within the meaning of the present invention, a smaller or lower resolution is therefore a poorer resolution.

The output signal generator is configured to convert the plurality of second start phase words and the plurality of second terminal phase words, which may each be understood as a bundle of numerical values, into the serial sequence of output pulses. This conversion multiplies the data rate. An output signal period of the sequence of output pulses is therefore several times shorter than the encoding period, the ratio of the encoding period to the output signal period being substantially determined by the quantity of the plurality of second start and terminal phase words, as will be explained in detail further below.

The phase interpolator is preferably configured to generate the plurality of second start phase words and the plurality of second terminal phase words in the form of respective vectors. Parallel conversion is preferably used, so that the plurality of second start phase words and the plurality of second terminal phase words are respectively provided approximately simultaneously by the phase interpolator.

A reconstruction filter configured to filter the digital output signal and to output a filtered output signal is preferably connected to the output signal generator downstream therefrom. The reconstruction filter may be a bandpass filter and as such may attenuate signal components from the digital output signal whose frequencies are above an upper limit or below a lower limit. The reconstruction filter is a passive bandpass filter or a passive low-pass filter, for example. The reconstruction filter may also be a cavity filter based on cavity resonators. The function of the reconstruction filter is essentially to suppress undesired signal components. It preferably has no or very little loss in active power.

Other preferred embodiments of the device that implement the first aspect of the present invention will now be described. The additional features of these additional preferred embodiments may be combined with each other to form other embodiments and/or with the optional features already mentioned above, unless these are explicitly described as alternatives to each other.

In one particularly preferred embodiment, a reference clock signal is fed to the output signal generator. In this embodiment, the output signal generator comprises:

a multiphase clock signal generator configured to derive a multiphase clock signal from the reference clock signal, said reference clock signal comprising a plurality of clock signals phase-shifted by discrete amounts of phase, the phase shift of said clock signals relative to the reference clock signal increasing, beginning at zero, by one phase shift from one clock signal to the next and, a start phase multiplexer and a terminal phase multiplexer, to the input side of each of which the multiphase clock signal is supplied, wherein the start phase multiplexer is configured to switch one of the phase-shifted clock signals, as a start phase signal, through to its output according to the plurality of second start phase words and the terminal phase multiplexer is configured to switch one of the phase-shifted clock signals, as a terminal phase signal, through to its output according to the plurality of second terminal phase words, and a signal combiner configured to combine the start phase signal and the terminal phase signal to form the digital output signal, by making the start phase signal trigger the rising edge of a respective output pulse in the output signal and making the terminal phase signal trigger the falling edge of the respective output pulse.

This embodiment has the advantage that the precision of the device, i.e. the precision with which the input signal is encoded into the pulse-width and/or phase modulated digital output signal, can above all be achieved via high precision of the multiphase clock signal generator, i.e. via a multiphase clock signal whose phase-shifted clock signals each have a rising and falling edge that are very precisely timed. In this embodiment, the digital output signal is effectively independent of the precision of the other circuit components, as the device is controlled by the input signal, yet it is not the input signal but rather the precision multiphase clock signal that is transformed into the digital output signal.

Another disadvantage of this embodiment is that phase and amplitude can be modulated independently of each other, so it is possible to compensate separately for amplitude- or phase-specific distortion in a power amplifier which can optionally be connected downstream from the output signal generator.

Another advantage of this embodiment is that the multiphase clock signal generator, like most of the other circuit components of the device, may be digitally implemented, and is therefore effectively independent of variations in the PVT values. Digital implementation of the multiphase clock signal generator is therefore preferred over analog implementation, which is likewise possible.

In order to generate a precision multiphase clock signal, the multiphase clock signal generator includes, for example, a delay-locked loop in the form of an integrated circuit. Except for possible phase inaccuracy of individual clock signals of the multiphase clock signal, the digital output signal which is generated does not show any additional timing fluctuations (jitter).

In one embodiment, the multiphase clock signal generator generates, for example, a multiphase clock signal with N clock signals phase-shifted in relation to each other. In this embodiment, one each of the plurality of second start phase words and terminal phase words, which are each at least Id(N) bits wide, are supplied as respective control signals to the start phase multiplexer and the terminal phase multiplexer.

In the embodiment with the multiphase clock signal generator, it is additionally preferred that the output signal generator includes a synchronization circuit to which the start phase signal and the terminal phase signal are supplied and which is configured to in transform the plurality of second start phase words and the plurality of second terminal phase words into a start phase selection signal and a terminal phase selection signal depending on the start phase signal and the terminal phase signal and to supply the start phase selection signal as a control signal to the start phase multiplexer and to supply the terminal phase selection signal as a control signal to the terminal phase multiplexer.

Feedback of the start phase signal and the terminal phase signal, as described above, advantageously ensures that the start phase multiplexers are not switched during a falling edge and that the terminal phase multiplexers are not switched during a rising edge.

In the above embodiment of the device with the multiphase clock signal generator, the output signal generator thus switches between discrete phase values, i.e. clock signals, in accordance with an interpolation method, such that the target pulse results on average. Phase interpolation is implemented by means of a delta sigma modulator, for example. The phase interpolator in this embodiment includes, for example, a first and a second delta sigma modulator, the first delta sigma modulator receiving the first start phase word and outputting the plurality of second start phase words, and the second delta sigma modulator receiving the first terminal phase word and outputting the plurality of second terminal phase words.

In order to average the phase jumps, a reconstruction filter is preferably connected to the output signal generator downstream therefrom.

In one embodiment, the frequency of the reference clock signal is substantially the same as the frequency of the digital output signal. The frequency of the reference clock signal may also deviate slightly. In that case, the frequency deviation would have to be compensated by continuous phase adjustment. This would have the advantage that single imprecise phases of the multiphase clock signal would be averaged out in the digital output signal and would have limited influence.

A single-phase reference clock signal is preferred.

The signal combiner is an RS flipflop, for example, to which the start phase signal, for example, is supplied via its S input and the terminal phase signal via its R input. A signal indicating the state of the RS flipflop forms the digital output signal.

In another preferred embodiment, the device includes a mapper to which the plurality of second start phase words and the plurality of second terminal phase words are supplied and which is configured to provide a plurality of mapped output signals according to the plurality of second start phase words and the plurality of second terminal phase words, wherein a respective one of the mapper output signals forms a pulse whose pulse width and phase are determined by a respective word pair which is formed from a respective one of the plurality of second start phase words and a respective one of the plurality of second terminal phase words.

In this embodiment, the device also includes an output multiplexer configured to convert the plurality of mapper output signals into the digital output signal.

This embodiment likewise allows the input signal to be converted into the digital output signal almost entirely by digital means and is therefore effectively independent of variations in the PVT values. Phase and amplitude can also be modulated independently of each other, so it is possible to compensate separately for amplitude- or phase-specific distortion in a power amplifier which can optionally be connected downstream from the output signal generator.

In the embodiment which includes the mapper, the phases of the output signal, i.e. the edges, are derived by a single high-frequency oscillator, e.g. by a phase locked loop. This results in precise clock phases in the output signal, which may also be more precise than in the embodiment with the multiphase clock signal generator. On the other hand, the latter embodiment can operate at a lower clock rate and to that extent have a lower power consumption.

Another advantage of this embodiment is that the output signal generator can be operated at an output signal generator clock rate which preferably amounts substantially to N times the fundamental frequency of the input signal to be encoded. The output signal generator clock rate, which is a single-phase signal, is preferably provided with quartz precision by a PLL (phase locked loop) circuit, or by a frequency multiplier.

The pulse of a respective mapper output signal is formed, for example, by a high data rate bit sequence. For this purpose, the mapper includes in one embodiment a first and a second thermometer encoder, the plurality of second start phase words being supplied to the first thermometer encoder and the plurality of second terminal phase words being supplied to the second thermometer encoder. The thermometer encoders may be standard thermometer encoders and be identical in structure. In this embodiment, output signals from the first thermometer encoder are supplied to first inputs of a plurality of AND gates, and inverted output signals from the second thermometer encoder are supplied to second inputs of the plurality of AND gates. The output signals from the plurality of AND gates are the plurality of mapper output signals.

The output signal multiplexer may be controlled, for example, by a binary counter which is operated at the clock rate of the output signal generator.

In one preferred embodiment, the phase encoder is operated at a phase encoder clock rate and/or the phase interpolator is operated at a phase interpolator clock rate, the phase encoder clock rate and the phase interpolator clock rate each being lower by at least a factor of two than the output signal generator clock rate.

This variant results in the advantage, already mentioned at the outset, of the device consuming less energy. The power loss of a circuit component decreases, namely, with decreasing clock rate.

In one particularly preferred embodiment, the phase encoder is configured to derive the first start phase word and the first terminal phase word in such a way that the time of the rising edge of a respective output pulse and the time of the falling edge of the respective output pulse are symmetrically varied with respect to a reference phase.

Pulse width modulation is therefore symmetrical in this embodiment. By means of this symmetrical pulse width modulation, the device modulates the amplitude independently of phase, since there is no change in the phase position, for example the middle of the pulse in terms of time, of consecutive pulses of the output signal. The reference phase is defined by the reference clock signal, for example.

The output signal generator is preferably configured
- to produce an output pulse with a permitted minimal pulse width in the digital output signal and then to suppress any subsequent output pulse or
- to suppress any output pulse and then to produce an output pulse with a permitted minimal pulse width in the digital output signal, if the pulse width of the target pulse falls below a prohibited minimum.

This embodiment has the advantage that the output signal generator only produces pulses whose pulse width is above the prohibited minimum, so that a power amplifier which can be optionally connected downstream can amplify the digital output signal with low distortion. The prohibited minimum may be freely defined, as can the permitted minimum pulse width, so that the device is adapted to the power amplifier which can be optionally connected downstream. The output signal generator accordingly interpolates a target pulse whose target pulse width is below the prohibited minimum by, for example, alternatingly generating an output pulse with permitted pulse width and omitting any preceding or following output pulse.

The input signal comprises an amplitude signal and a phase signal, for example. The generated digital output signal is an HF signal, for example, that is sufficiently described on the input side by the amplitude signal and the phase signal, both of which may be present in digital form. It then suffices to feed just the amplitude signal and the phase signal to the phase encoder. The amplitude signal and the phase signal may be present in the form of a digital baseband signal, i.e., as a signal which merely represents the modulation content, but not the carrier frequency.

The phase interpolator preferably includes at least one delta sigma modulator (DSM) for the purpose of conversion. The phase interpolator preferably includes a first and a second delta sigma modulator, the first delta sigma modulator receiving the first start phase word and outputting the plurality of second start phase words, and the second delta sigma modulator receiving the first terminal phase word and outputting the plurality of second terminal phase words.

A modulator of this type has particularly good spectral properties. The DSM can interpolate a high-resolution, low-frequency signal with a low-frequency, high-frequency signal. Due to the lower resolution of the second phase words, it is essentially possible that numerical noise, or "quantization noise", is produced. However, this quantization noise can be influenced in a DSM in such a way that it is relatively strong at frequencies far beyond the target frequency range of the digital output signal and relatively weak in the target frequency range. If a reconstruction filter is connected downstream, this preferably attenuates precisely those frequency components with the relatively strong quantization noise in such a way that signal components in the target frequency range are not affected by such attenuation.

One advantage of the DSM, therefore, is that any interference possibly caused by conversion, such as the quantization noise described above, can be shifted by the DSM to frequency ranges that are far beyond the target frequency range. In this way, the signal degeneration can simply be filtered out.

The DSM may also be realized entirely in digital form and as a result is insensitive to PVT variations (PVT stands for "process, voltage, temperature").

These positive characteristics of the DSM thus have advantageous implications for the device as a whole.

A second aspect of the present invention is a power amplifier having a device according to any of claims 1 to 8. More particularly, an arrangement is proposed in which the power amplifier receives and then amplifies the digital output signal from the output signal generator and outputs the amplified digital output signal. The power amplifier is a Class-D power amplifier, for example, which is preferably implemented in its entirety with digital circuit technology.

A third aspect of the present invention is a transmission arrangement which includes a device according to any of claims 1 to 8 or with a power amplifier according to claim 9. More particularly, an arrangement is proposed in which a power amplifier is optionally connected to the output signal generator downstream therefrom and in which a transmission arrangement which is configured to transmit externally the amplified digital output signal or the digital output signal is connected downstream from the power amplifier or the output signal generator.

According to a fourth aspect of the present invention, a method is proposed for encoding an input signal into a digital pulse-width and/or phase modulated output signal, referred to hereinafter as a digital output signal, said method comprising the following steps:

receiving the input signal, deriving a binary first start phase word and a binary first terminal phase word from the input signal, with a first resolution, wherein
the first start phase word determines a starting time within an encoding period, at which a rising edge of a target pulse is to occur in the digital output signal, and the first terminal phase word determines a termination point within the encoding period, at which a falling edge of the target pulse is to occur in the digital output signal, converting the first start phase word into a plurality of second binary start phase words and the first terminal phase word into a plurality of second binary terminal phase words, with a second resolution that is smaller than the first resolution, wherein
a respective second start phase word describes one of N possible discrete times in the encoding period and thus approximately determines the starting time with the second resolution, and a respective second terminal phase word describes one of the N possible discrete times in the encoding period and thus approximately determines the termination point with the second resolution, converting the plurality of second start phase words and the plurality of second terminal phase words into a serial sequence of output pulses, the serial sequence of output pulses corresponding on average over time to the target pulse, and outputting the serial sequence of output pulses as a digital output signal.

The method of the fourth aspect of the present invention shares the advantages of the device according to the first aspect of the invention. The method of the fourth aspect of the invention may be embodied in different variants and may include additional steps, these variants being distinguished above all by additional features that correspond essentially to the additional features of claims 2 to 8. For example, the method is preferably performed in such a way that the pulse widths of successive output pulses are varied symmetrically with respect to a reference edge and/or that a target pulse with an unpermissibly low pulse width is mapped in the output signal by generating a pulse with a permitted minimum pulse width and by omitting a previous or following pulse.

The method according to the invention is a digital modulation method which realizes phase modulation or pulse width modulation or a combination of phase and pulse width modulation. Accordingly, reference will also be made in the following to a phase modulation method or to a pulse width modulation method. If reference is to a modulation method, then this may be a phase modulation method or a pulse width modulation method, or a modulation method which realizes a combination of phase and pulse width modulation.

In particular, an embodiment of the method is preferred in which conversion includes:
providing a reference clock signal,
deriving a multiphase clock signal from the reference clock signal, the reference clock signal comprising a plurality of clock signals phase-shifted by discrete amounts of phase, the phase shift of said clock signals relative to the reference clock signal increasing, beginning at zero, by one phase shift from one clock signal to the next,
selecting a first of the plurality of clock signals according to the plurality of second start phase words and providing the selected first clock signal as the start phase signal,
selecting a second of the plurality of clock signals according to the plurality of second terminal phase words and providing the selected second clock signal as the terminal phase signal,
combining the start phase signal and the terminal phase signal to form the output signal, by making the start phase signal trigger the rising edge of a respective output pulse in the digital output signal and making the terminal phase signal trigger the falling edge of the respective output pulse.

In another preferred embodiment of the method according to the fourth aspect of the present invention, conversion includes:
generating a plurality of mapper output signals according to the plurality of second start phase words and the plurality of second terminal phase words by means of a mapper, wherein
a respective one of the mapper output signals forms a pulse whose pulse width and phase are determined by a respective word pair which is formed from a respective one of the plurality of second start phase words and a respective one of the plurality of second terminal phase words, and
serially outputting the plurality of mapper output signals as the digital output signal.

The plurality of mapper output signals is preferably generated at a high generator clock rate which is substantially higher, at least by a factor of two, than the clock rate at which the previous derivation was carried out, and/or than the clock rate at which the previous conversion was carried out. The pulse of a respective mapper output signal is formed, for example, by a high data rate bit sequence, which has already been described in more detail above, with reference to the respective embodiment of the device.

A fifth aspect of the present invention is a method for transmitting a high-frequency output signal, wherein a low-frequency input signal is transformed by a method according to the fourth aspect of the present invention into the high-frequency digital pulse-width and/or phase modulated output signal and then transmitted.

Other embodiments and the advantages of the invention shall now be described with reference to the attached drawings.

BRIEF DESCRIPTION OF THE DRAWINGS

The drawings show, in schematic views.

DETAILED DESCRIPTION OF EMBODIMENTS

Figure 1:
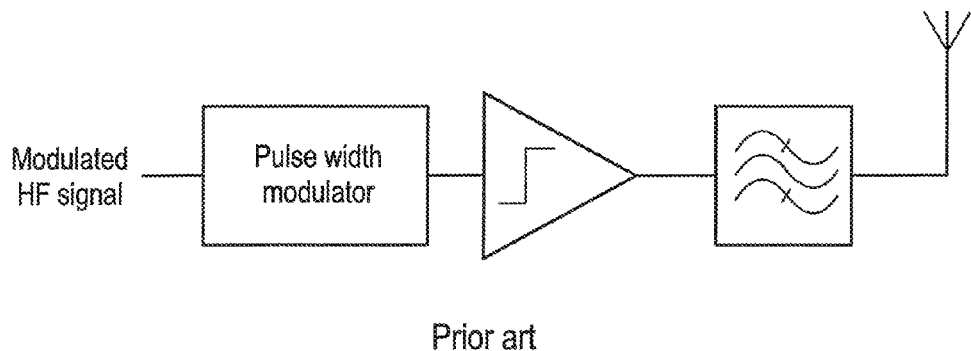
FIG. 1 an HF Class-D power amplifier according to the prior art.
Figure 2:
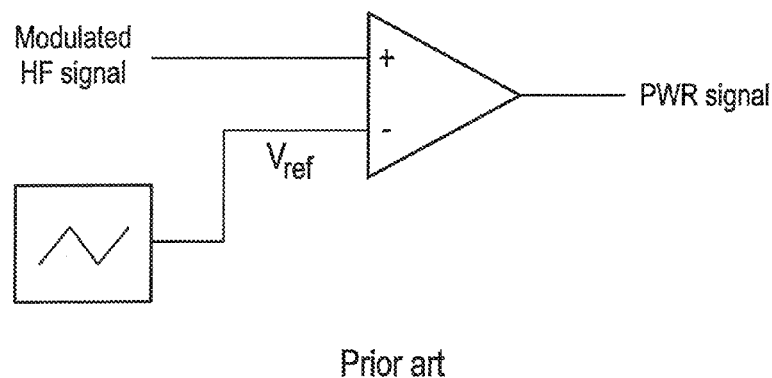
FIG. 2 a typical implementation of a pulse width modulator according to the prior art.

The modulation method according to the invention shall now be described. The phase and amplitude of the input signal can be modulated here independently of one another. It is thus possible, on the basis of the invention, to realize pulse width modulation or a combination of phase and pulse width modulation.

For better understanding, phase and amplitude modulation shall therefore be treated separately in the following. To this end, FIGS. 3 to 7 show various sketches of signal waveforms. The uppermost signal waveform in each case is a provided reference clock signal 132 having a reference clock period 133. The middle signal waveforms each show a multiphase clock signal 134 derived therefrom, the dashes perpendicular to each other indicating a plurality of discrete clock signals $\phi_1 \ldots \phi_N$ phase-shifted by discrete amounts of phase, the phase shift of said clock signals relative to the reference clock signal 134 increasing, beginning at zero, by one phase shift from one clock signal to the next. The bottommost signal waveform in each case shows a generated digital output signal 162, in which perpendicular lines mark a pulse center 164 of a pulse in the output signal or a target phase position 166. Also shown are a target pulse 108 and a target pulse with prohibited pulse width 168.

Figure 3:
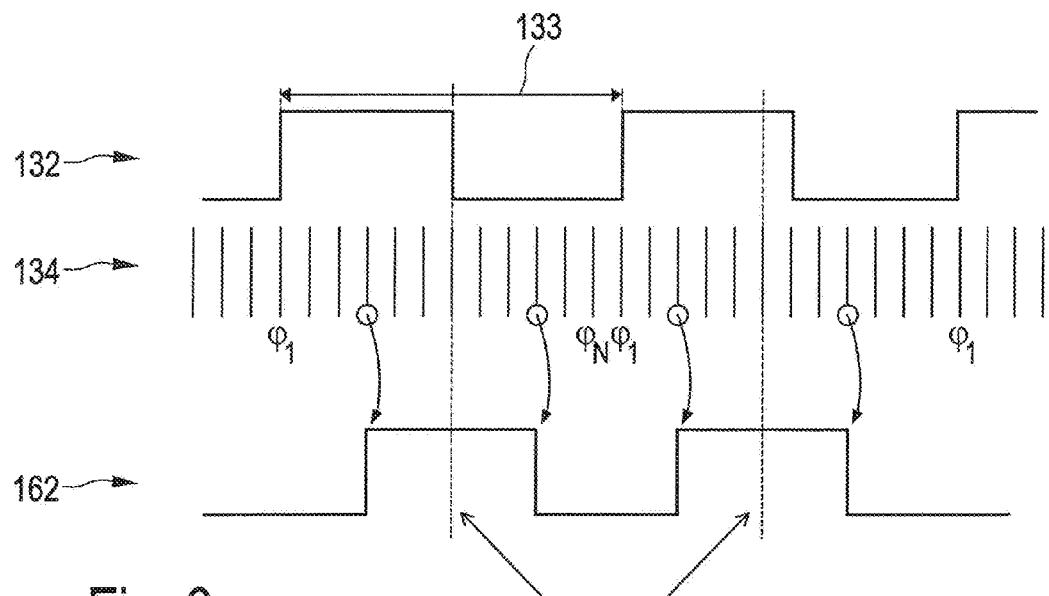
FIG. 3 a sketch for describing a time-discrete phase modulation method according to the invention.

A sketch for describing the principle of the phase modulation method according to the invention is shown in FIG. 3. According to FIG. 3, a multiphase clock signal 134 is derived from a reference clock signal 132. Reference clock signal 132 may have a frequency that is exactly the same as a carrier frequency of the output signal 162 (shown by way of example in FIGS. 8 and 10), or which deviates somewhat therefrom. By selecting discrete phases $\phi_1 \ldots \phi_N$ of the multiphase clock signal 134, i.e. by selecting clock signals which are phase shifted by discrete amounts of phase, a digital output signal 162 with pulses of constant pulse width is generated, the phase position of which can be adjusted in the clocking grid for the multiphase clock signal 134. This allows time-discrete phase modulation to be realized.

Figure 4:
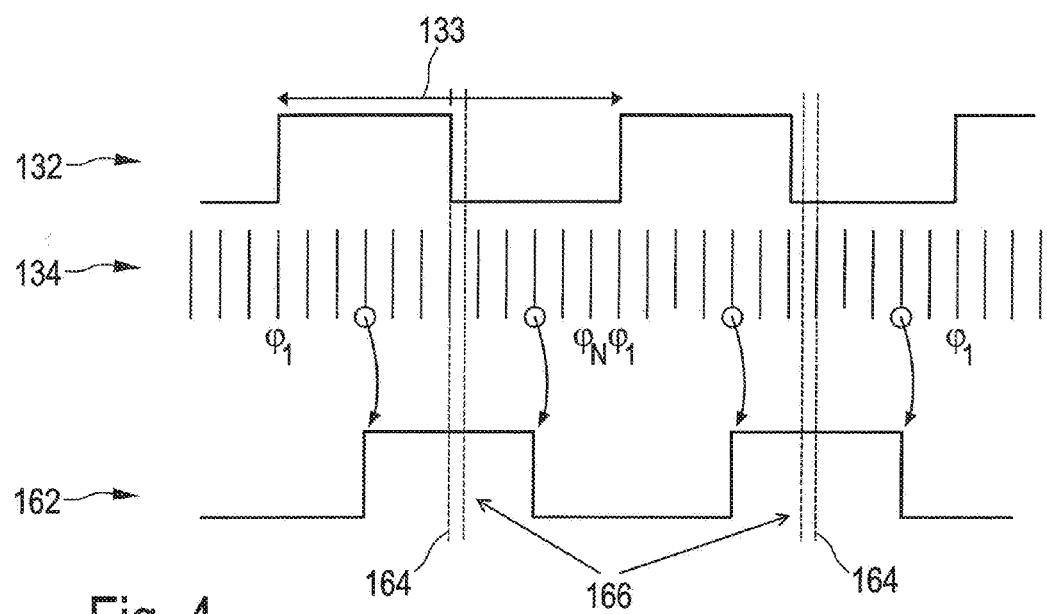
FIG. 4 a sketch for describing a time-discrete phase modulation method according to the invention, with phase interpolation by dithering.

In general, one would like to generate not only time-discrete phase values ($\phi_1 \ldots \phi_N$), but also any arbitrary phase values. This cannot be achieved by phase interpolation. The discrete phase values $\phi_1 \ldots \phi_N$ are switched according to a suitable interpolation method in such a way that the target phase results on average, as shown in FIG. 4. This technique can also be called "dithering". Phase interpolation by delta sigma modulation of the phase, for example, is well suited due to its favorable spectral characteristics. If a reconstruction filter optionally connectable downstream is provided with a suitable narrow-band design and the phase has a high switching frequency, i.e. a high output signal generator clock rate, phase jumps in the digital output signal 162 are averaged out by the reconstruction filter.

Figure 5:
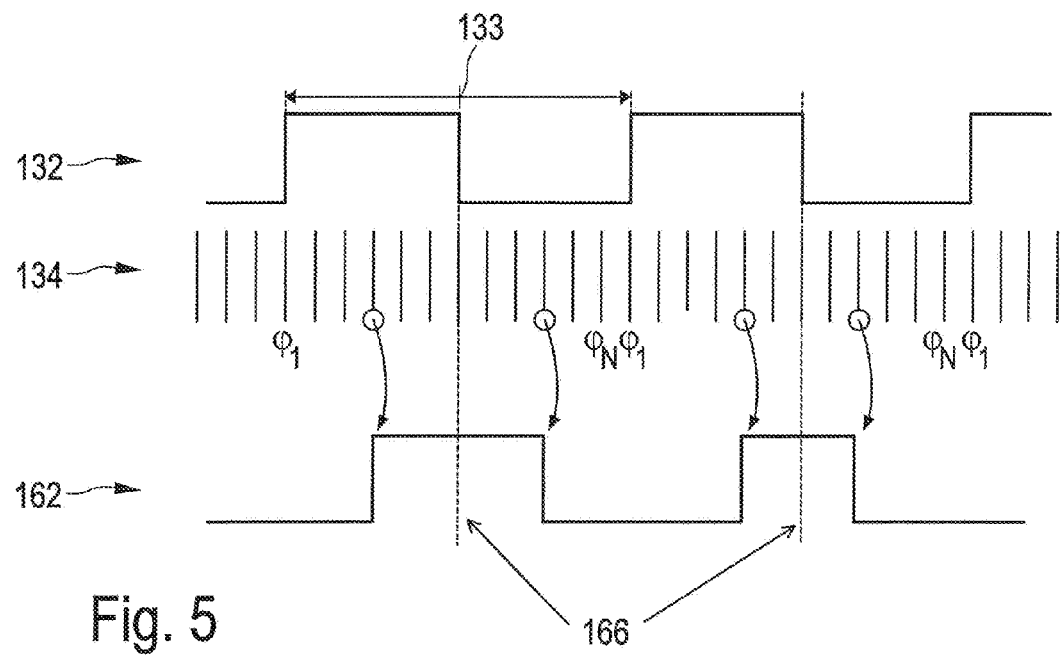
FIG. 5 a sketch for describing a time-discrete symmetrical pulse width modulation method according to the invention.

FIG. 5 now shows time-discrete symmetrical pulse width modulation (PWM). By selecting different phases $\phi_1 \ldots \phi_N$ for the multiphase clock signal 134, a discrete pulse-width modulated digital output signal 162 is generated here. In pure PWM without phase modulation, the rising and falling edges of a pulse in the digital output signal 162 are always selected symmetrically with respect to the fixed target phase position 166, with the result that the phase position of the pulse-width modulated digital output signal 162 (e.g. at the center of a pulse) always remains the same.

Figure 6:
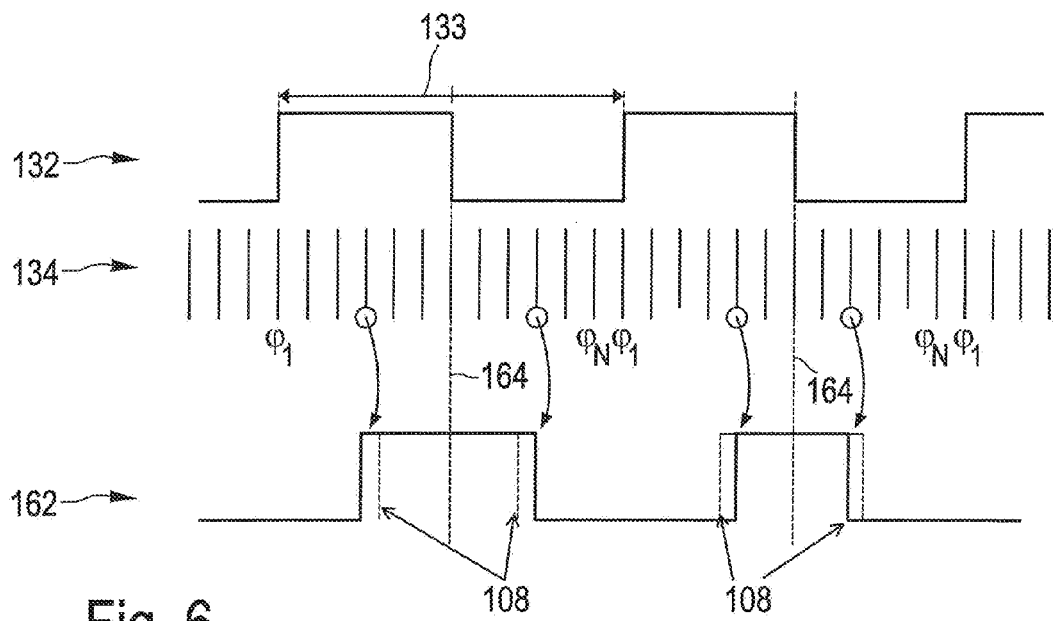
FIG. 6 a sketch for describing a time-discrete symmetrical pulse width modulation method according to the invention, with pulse width interpolation by dithering.

If a continuous pulse width is now to be interpolated, i.e. a target pulse is to be generated that cannot be represented by a single pulse in which the timing of the rising edge and the falling edge is determined by a word pair comprising a second start phase word and a second terminal phase word, it is possible to proceed in a manner that is analogous with phase modulation. This case is shown in FIG. 6, in which the target pulse width of target pulse 108 is approximated by switching between discrete pulse widths in such a way that, on average, the target pulse width is produced in the digital output signal 164. An amplitude modulated signal whose amplitude corresponds to the respective target pulse width appears at the output of a reconstruction filter which can be optionally connected downstream.

One preferred modulation method according to the invention ensues from simultaneously applying interpolating phase modulation and interpolating symmetrical pulse width modulation.

Figure 7:
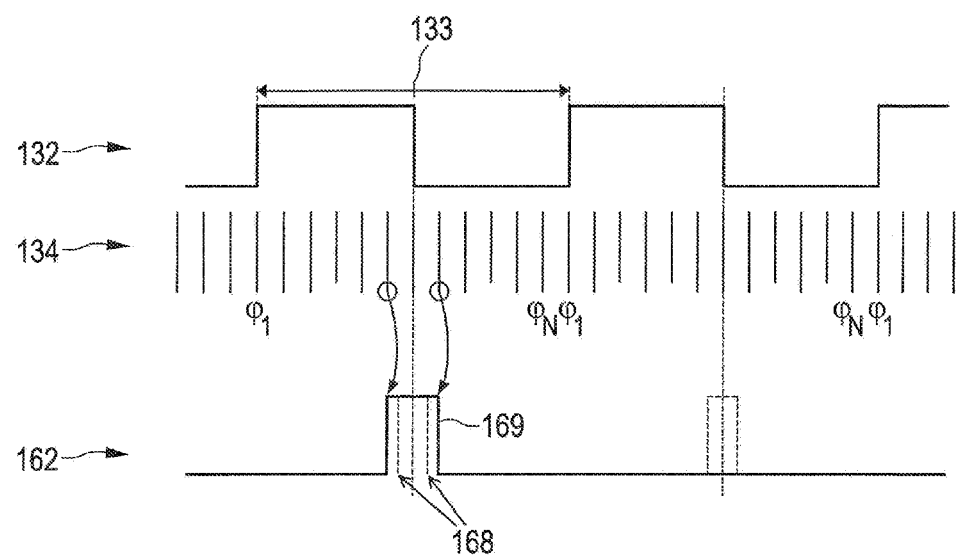
FIG. 7 a sketch for describing a time-discrete pulse width modulation method according to the invention, with pulse width interpolation by masking small pulse widths.

One advantageous configuration of the modulation method prevents the pulse widths from being too small and is described in the following with reference to FIG. 7. When the pulse width 168 of digital output signal 162, which can form an input signal for a switching amplifier optional connectable downstream, is too small, the amplifier can no longer amplify the digital output signal 162 with low distortion, since a full output amplitude is not reached. The modulation method according to the invention also allows suppression (masking) of pulse widths 168 that are too small. The minimum permitted pulse width 169 can be programmed at will, depending on the power amplifier that is being used. If smaller pulse widths 168 are nevertheless to be interpolated, the procedure applied is the one shown in FIG. 7, in which target pulse widths 168 smaller than the minimum pulse width 169 are interpolated by suitable switching between minimum pulse widths and omission of the pulse. Interpolation can be carried out according to different rules, inter alia with delta sigma modulation.

Figure 8:
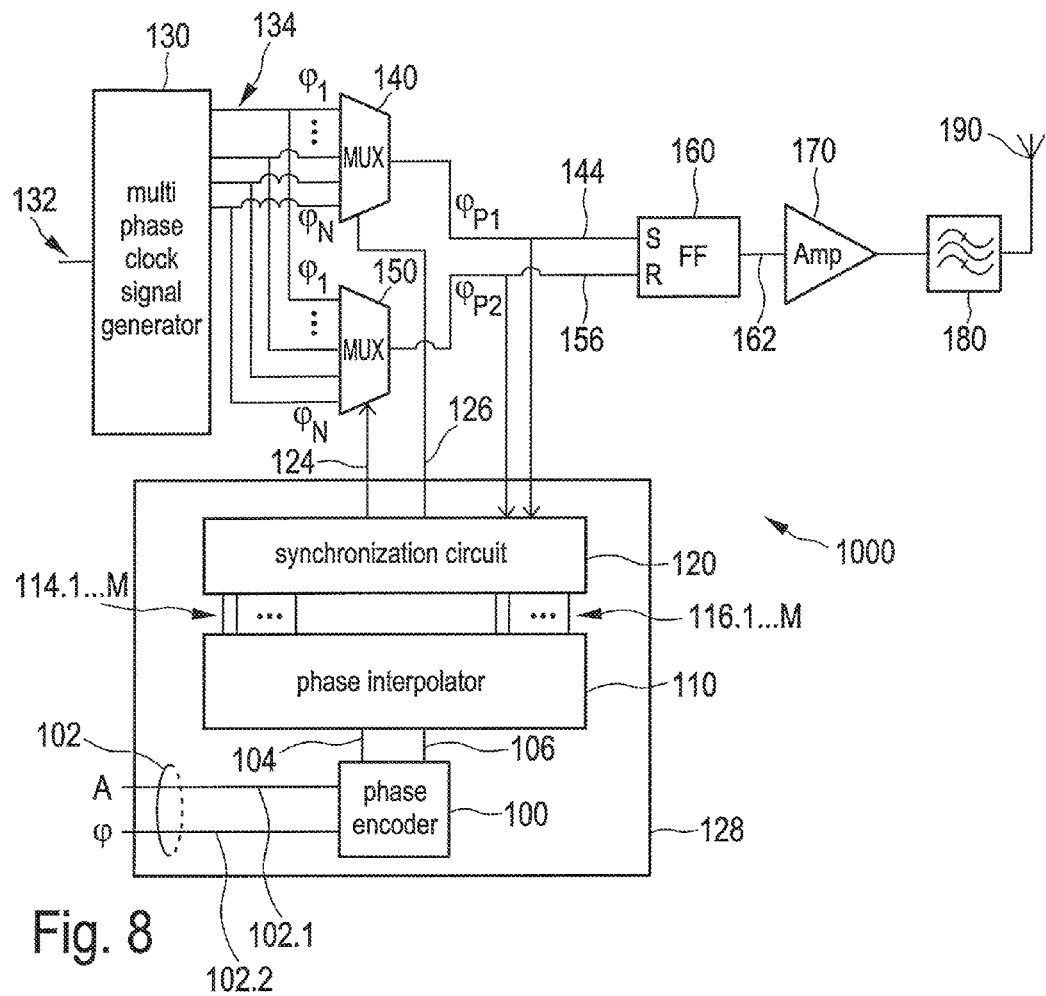
FIG. 8 an embodiment of a device according to the invention, with a multiphase clock generator.
Figure 12:
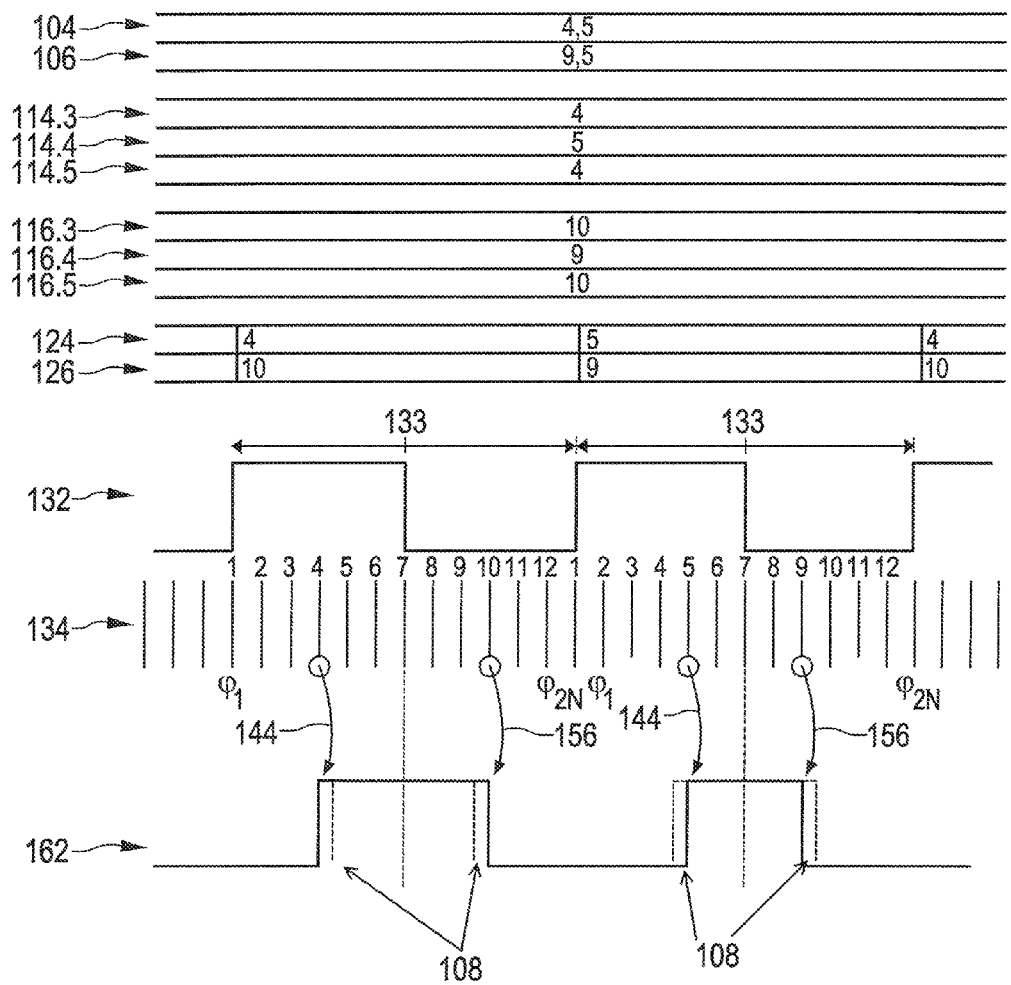
FIG. 12 a schematic view of signal waveforms in an embodiment of the device having a multiphase clock signal generator and
FIG. 13 a schematic view of signal waveforms in an embodiment of the device having a mapper.

The modulation method according to the invention may be implemented, for example, by the circuit 1000 which is shown in FIG. 8 and which contains an embodiment of the inventive device with a multiphase clock signal generator. FIG. 12, to which reference is likewise made in the following, shows a schematic view of signal waveforms obtained with this embodiment of the device with a multiphase clock signal generator. Circuit 1000 generates the digital pulse width and/or phase modulated output signal 162 from an input signal 102 in the form of a digital amplitude signal 102.1 and of a digital phase signal 102.2. In addition, circuit 1000 includes a power amplifier 170 connected downstream, a reconstruction filter 180 and a transmission arrangement 190 for transmitting the amplified and filtered digital output signal.

The device shown in FIG. 8 comprises a phase encoder 100, a phase interpolator 110 and a synchronization circuit 120, which in their entirety form a pulse control circuit 128. This pulse control circuit 128 provides a start phase selection signal 124 and a terminal phase selection signal 126, which are supplied to a start phase multiplexer 140 and a terminal phase multiplexer 150, respectively.

The device in FIG. 8 also includes a multiphase clock signal generator 130 which derives a multiphase clock signal 134 having a plurality N of clock signal phase shifted with respect to each other, as characterized above, from a reference clock signal 132 supplied to it; cf. FIG. 12. The start phase multiplexer 140 and the terminal phase multiplexer 150 receive the multiphase clock signal 134. Their outputs are coupled to inputs of a signal combiner 160 that generates the digital output signal 162. The multiphase clock signal generator, the start phase multiplexer 140, the terminal phase multiplexer 150 and the signal combiner 160 thus form an output signal generator which is controlled by pulse control circuit 128.

The start phase multiplexer 140 selects one of the plurality of phase-shifted clock signals $\phi_{P1}$ according to the start phase selection signal 124, and the terminal phase multiplexer selects one of the plurality of phase-shifted clock signals $\phi_{P2}$ according to the terminal phase selection signal 126. They output the selected signals as start phase signal 144 and terminal phase signal 156, respectively. These signals are supplied to inputs of signal combiner 160, which is present here in the form of an RS flipflop, for example. The digital output signal 162 appears at the output of signal combiner 160, with a rising edge of a respective pulse being triggered by the start phase signal 144 ($\phi_{P1}$) and a falling edge of the respective pulse being triggered by the terminal phase signal 156 ($\phi_{P2}$). Power amplifier 170, reconstruction filter 180 and transmission arrangement 190 are all connected to signal combiner 160 downstream therefrom.

At the input of pulse control circuit 128, amplitude signal 102.1 is applied in the form of a baseband signal A representing the envelope (amplitude), and phase signal 102.2 in the form of a baseband signal $\phi$ representing the phase. These two baseband signals form input signal 102.

The clock frequency of baseband signals A, $\phi$ may be substantially smaller than the frequency of reference clock signal 132.

Pulse control circuit 128 derives a first start phase word 104 and a binary first terminal phase word 106 with a first resolution from the two baseband signals A and $\phi$ by means of the phase encoder. In the example shown in FIG. 12, the first start phase word 104 has the value 4.5 and the first terminal phase word has the value 9.5. A target pulse 108, shown by broken lines in the bottom waveform in FIG. 12, is thus defined.

The first start phase word 104 and the first terminal phase word 106 thus determine which clock phases/clock signals of the multiphase clock signal 134 are selected for pulse generation, clock signal $\phi_{P1}$ being determined by the first start phase word 104 and clock signal $\phi_{P2}$ by the first terminal phase word 106. In other words, the first start phase word 104 determines a starting time within an encoding period, at which a rising edge of a target pulse is to occur in the digital output signal 162, and the first terminal phase word determines a termination point within the encoding period, at which a falling edge of the target pulse is to occur in the digital output signal 162.

Phase interpolator 110 is connected downstream from phase encoder 100 and converts the first start phase word 104 into a plurality of second binary start phase words 114.1 ... M and the first terminal phase word 106 into a plurality of second binary terminal phase words 116.1 ... M, with a second resolution that is smaller than the first resolution. In the example shown in FIG. 12, the plurality of second start phase words have the values 4, 5 and 4 and the plurality of second terminal phase words have the values 10, 9 and 10.

The width of a respective second start phase word 114.*i* and of a respective second terminal phase word 116.*i* is defined by the quantity N of clock signals/clock phases. It is equal to at least Id(N) bits.

A respective second start phase word 114.*i* describes one of N possible discrete time points in the encoding period and thus approximately determines the starting time with the second resolution. A respective second terminal phase word 116.*i* describes one of N possible discrete time points in the encoding period and thus approximately determines the terminal time with the second resolution. Phase interpolator 110 thus converts the first start phase word 104 and the first terminal phase word 106 in such a way that the plurality M of second binary start phase words 116.1 ... M (104, 106) and the plurality M of second binary terminal phase words 114.1 ... M can be interpolated, for example with the aid of a delta sigma modulator.

Hence, the word widths of the first start phase signal 104 and of the first terminal phase signal 106 are typically greater than the widths of a respective second start phase word 114.*i* and of a respective second terminal phase word 116.*i*. The word widths of the first start phase signal 104 and of the first terminal phase signal 106 may be of any length, i.e. the first resolution may be of any degree, and are/is not dependent on the number N of realizable clock signals.

The plurality M of second start phase words 114.1 ... M and the plurality M of second terminal phase words 116.1 ... M may each be present as vectors.

The start phase signal 144 ($\phi_{P1}$) and the terminal phase signal 156 ($\phi_{P2}$), which are needed to synchronize the start phase selection signal 124 and the terminal phase selection signal 126, are applied at the input of synchronization circuit 120. A present start phase selection signal 124 is synchronized thereby by a preceding start phase signal 144, and a present terminal phase selection signal 126 is synchronized by a preceding terminal phase signal 156.

Synchronization circuit 120 has the plurality M of second start phase words 114.1 ... M and the plurality M of second terminal phase words 116.1 ... M at its input and multiplexes these to the M-fold data rate so that a respective second start phase word 114.*i* and a respective second terminal phase word 116.*i* is applied at the output of pulse control circuit 128 and hence as a start phase selection signal 124 and as a terminal phase selection signal 126, respectively, at control inputs of start phase multiplexer 140 and terminal phase multiplexer 150, respectively.

The result is that synchronization circuit 120 supplies the start phase selection signal 124 and the terminal phase selection signal 126 to the respective multiplexers 140 and 150. These signals are likewise shown in FIG. 12. Depending on these signals, multiplexers 140, 150 switch one of their input signals through to their respective output. This is shown in FIG. 12 for two cases, namely for the case where {second start phase word=4; second terminal phase word=10} and for the case where {second start phase word=5; second terminal phase word=9}. Output signal 162 is produced accordingly, and in this way the target pulse 108 calculated by phase encoder 100 is approximated ("dithering").

Figure 9:
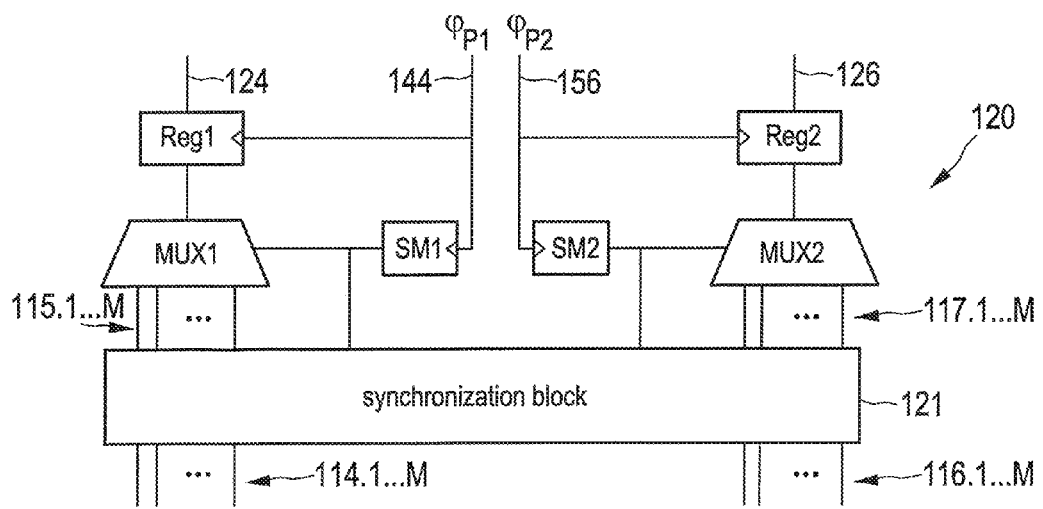
FIG. 9 a possible implementation of the synchronization circuit in FIG. 8.

FIG. 9 shows a possible implementation of synchronization circuit 120. The fed-back start phase signal 144 clocks a first state machine SM1, which generates a first control signal for a first multiplexer Mux1. The fed-back start phase signal 144 also clocks a first register Reg1, as a result of which the start phase selection signal 124 is synchronized with the fed-back start phase signal 144, i.e. its timing is brought into synchrony with the latter. In analogous manner, the fed-back terminal phase signal 156 clocks a second register Reg2 and a second state machine SM2 that controls a second multiplexer Mux2. In this way, the terminal phase selection signal 126 is synchronized with the terminal phase signal 156, i.e. its timing is brought into unison with the latter.

Since a plurality of signals 134 having different clock phases are supplied to multiplexers 140 and 150, and the phases of signals 144 and 156 also vary, what might happen if there is no synchronization circuit is that one or more of the aforementioned phase signals 134, 144 and/or 156 has a rising and/or a falling edge at the moment that multiplexer 140 and/or 150 switches. Signal 144 and/or 156 can have distorted edges as a result, and the signal would no longer comply with a clock/phase grid. For this reason, any switching of multiplexers 140 and/or 150 should take place at a moment in time at which neither signals 144 and 156, nor a new signal to be switched through from the plurality of signals 134 has a rising or a falling edge.

If it assumed that, when the phase and pulse width are interpolated, switching is above all between immediately adjacent phases, then synchronization can be advantageously achieved by using clocking signals 144 and 156 to clock multiplexer control signals 124 and 126 and state machines SM1 and SM2. Registers Reg1 and Reg2 should then be slow enough so that output multiplexer control signals 124 and 126 are not outputted, and hence that start phase multiplexer 140 and terminal phase multiplexer 160, respectively, are not switched until the start phase signal 144 and the terminal phase signal 156 have been applied stably for a sufficiently long time.

Start phase multiplexer 140 and terminal phase multiplexer 150 generate the start phase signal 144 and the terminal phase signal 156, respectively, with a clock frequency which is M times as high as the frequency of baseband signals A and cp. Both signals have an alternating phase position. The first and second multiplexers Mux1, Mux2 are controlled by the first and second state machines SM1 and SM2, respectively, which follow the changing phase positions of start phase signal 144 and terminal phase signal 156, so the requirements to be met by the phase position of the input signals (115.1 ... M and 117.1 ... M) of Mux1 and Mux2 change continuously during operation. The other baseband signals A and φ have a fixed clock rate, in contrast. For that reason, a synchronization block 121 is provided to initially delay the plurality M of second start phase words 114.1 . . . M and the plurality M of second terminal phase words 116.1 . . . M in a suitable manner so that plurality M of second start phase words 114.1 . . . M and plurality M of second terminal phase words 116.1 . . . M are applied with the correct phase, as respective input signals 115.1 . . . M and 117.1 . . . M, to the input of first multiplexer Mux1 and the input of second multiplexer Mux2. To this end, output signals of the first state machine SM1 and of the second state machine SM2 are supplied to synchronization block 121 so that a buffer memory installed therein is read out asynchronously. One way of realizing synchronization block 121 is to form two first-in, first-out (FIFO) memories, for example.

Figure 10:
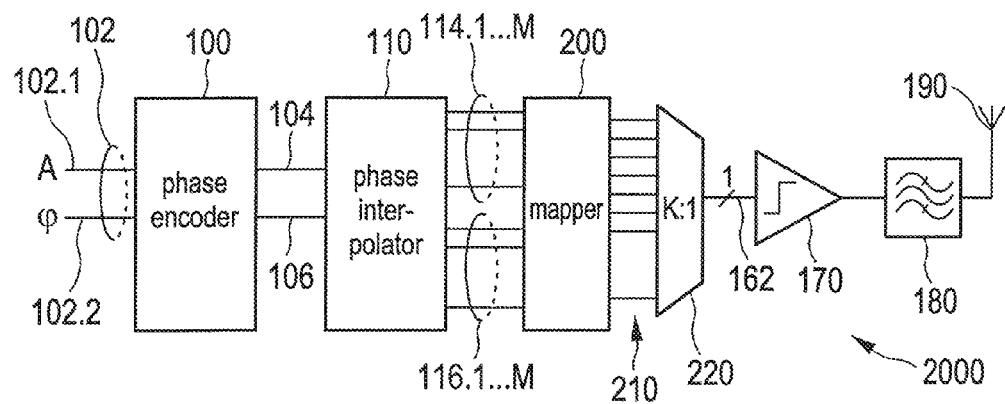
FIG. 10 another embodiment of a device according to the invention, with a mapper.
Figure 13:
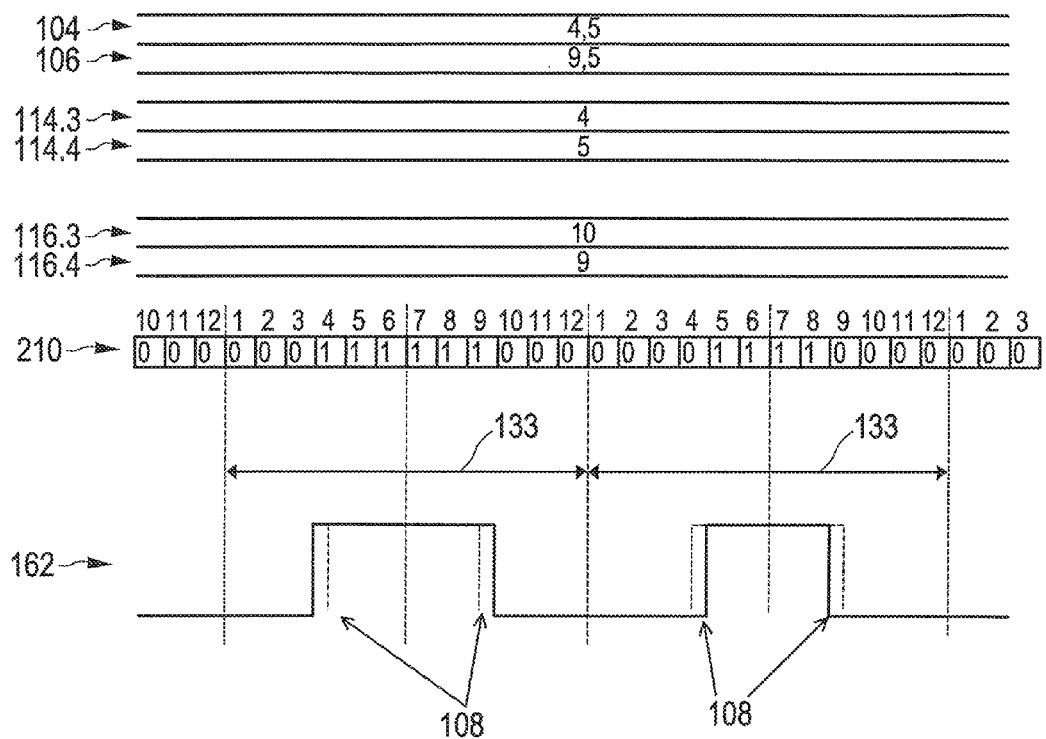

The modulation method according to the invention may likewise be implemented by a circuit 2000 which is shown in FIG. 10 and which contains an embodiment of the inventive device with a mapper. Respective signal waveforms for this embodiment are shown by way of example in FIG. 13, to which reference is likewise made in the following. Circuit 2000 generates the digital pulse width and/or phase modulated output signal 162 from input signal 102, which is supplied in the form of a digital amplitude signal 102.1 and a digital phase signal 102.2.

Like circuit 1000 as well, circuit 2000 includes a phase encoder 100 and a phase interpolator 110, which operate in the manner already described with reference to FIG. 8 and FIG. 12. However, the output signal generator here does not include a multiphase clock signal generator or any signal combiner in the above sense, but rather a mapper 200 and an output multiplexer 220 connected downstream therefrom, which generates the digital output signal 162.

Connected downstream from the output multiplexer 220 are a power amplifier 170, a reconstruction filter 180 and a transmission arrangement 190 for transmitting the amplified and filtered digital output signal.

Circuit components 100, 110 and 200 are preferably implemented on a common digital signal processor, which is abbreviated in the following to DSP. Output multiplexer 220 may also be part of the DSP.

Circuit 2000 basically operates as follows: On the input side, the input signal is applied in the form of a baseband signal A representing an amplitude (amplitude signal 102.1) and in the form of a baseband signal φ representing a phase (phase signal 102.2). Depending on the plurality M of second start phase words 114.1 . . . M and the plurality M of second terminal phase words 116.1 . . . M, mapper 200 generates a plurality M of mapper output signals 210 which are supplied to fast output multiplexer 220 in accordance with word pairs {4; 10} and {5; 9}, as in the example shown in FIG. 13. From the plurality M of mapper output signals 210, output multiplexer 220 generates the digital output signal 162 in the form of a serial bit stream one bit wide and with a bit rate of $f_{BIT}$ that is substantially greater than the frequency $f_{EIN}$ of input signal 102.

Power amplifier 170 generates an amplified pulse signal that is supplied to the transmission arrangement, for example an antenna, via reconstruction filter 180. Digital output signal 162 form a phase and pulse-width modulated signal that is one bit wide. If, for example, $f_{BIT}=N*f_{EIN}$, a pulse-width and phase modulated signal having N discrete clock phases is obtained.

The plurality M of second start phase words 114.1 . . . M and the plurality M of second terminal phase words 116.1 . . . M are applied, for example, in the form of a vector in each case, to the input of the mapper, which accordingly provides the mapper output signals 210, a respective one of the mapper output signals 210 forming a pulse whose pulse width and phase are determined by a respective word pair formed from a respective one of the plurality of second start phase words 114.i, where i is an element of the row of numbers 1 . . . M, and a respective one of the plurality of second terminal phase words 116.i. A mapper output signal is thus a constructed data word which corresponds in each case to a period of a PWM signal, that is to say, of N bits, for example, where N represents the number of discrete phases of the digital output signal. The constructed data word consists of a sequence of successive ones and zeros, each 0-1 transition occurring at the place marked by the respective second start phase word 114.i and a 1-0 transition occurring at the place marked by the respective second terminal phase word 116.1. To name one example, with reference to FIG. 13: N=12; the numerical value of a second start phase word 114.3=4 and the numerical value of a second start phase word 114.4=5; the numerical value of a second terminal phase word 116.3=10 and the numerical value of a second terminal phase word 116.4=9. This constellation results in a first constructed data word 000111111000, i.e. in a pulse that maps this first data word, i.e. a pulse that has the value 0 during the first and last three twelfths of a PWM period, and the value 1 therebetween, and in a second constructed data word 000011110000, i.e. in a pulse that maps this second data word, i.e. a pulse that has the value 0 during the first and the last four twelfths of a PWM period, and the value 1 therebetween. Mapper 200 accordingly constructs from M word pairs M data words each with a length of N bits, in the form of respective brief pulses 210 which it outputs in parallel to the downstream output multiplexer 220. The output multiplexer multiplexes the K=M*N bits to form a bit stream that is 1 bit wide and thus generates the digital output signal 162. It can be seen from FIG. 12, in turn, that target pulse 108 is approximated in this manner.

Figure 11:
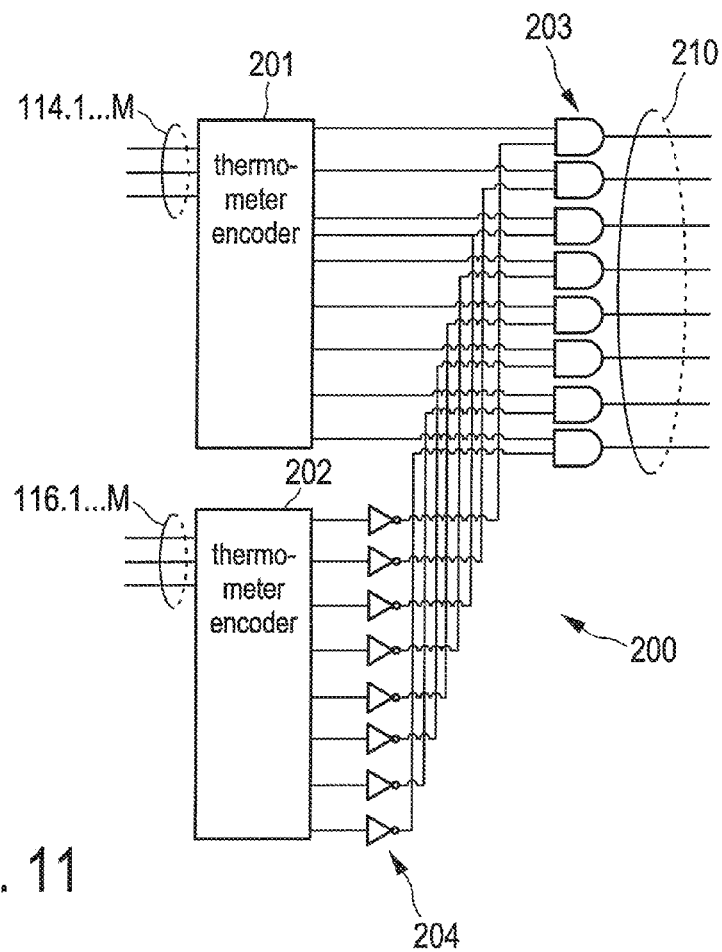
FIG. 11 a schematic view of a block diagram of an embodiment of a mapper.

FIG. 11 shows a schematic view of a possible embodiment of mapper 200. In this embodiment, the mapper contains a first thermometer encoder 201 and a second thermometer encoder 202, the plurality of second start phase words 114.1 . . . M being supplied to the first thermometer encoder 201 and the plurality of second terminal phase words 116.1 . . . M being supplied to the second thermometer encoder 202. Thermometer encoders 201 and 202 may be standard thermometer encoders and identical in structure to one another. Output signals from the first thermometer encoder 201 are supplied to first inputs to a plurality of AND gates 203, and output signals from the second thermometer encoder 202 are supplied to a plurality of inverters 204. The inverted output signals from the second thermometer encoder 202 are supplied to second inputs of the plurality of AND gates 203. The output signals from the plurality of AND gates are the plurality of mapper output signals 210.

LIST OF REFERENCE SIGNS

100 Phase encoder
102 Input signal
102.1 Amplitude signal
102.2 Phase signal
104 First start phase word
106 Second start phase word
108 Target pulse
110 Phase interpolator
114.1 . . . M Plurality of second start phase words
115.1 . . . M Input signals of the first multiplexer Mux1
116.1 . . . M Plurality of second terminal phase words
117.1 . . . M Input signals of the second multiplexer Mux2
120 Synchronization circuit
121 Synchronization block 124 Start phase selection signal
126 Terminal phase selection signal
128 Pulse control circuit
130 Multiphase clock signal generator
132 Reference clock signal
133 Reference clock signal period
134 Multiphase clock signal
140 Start phase multiplexer
144 Start phase signal
150 Terminal phase multiplexer
156 Terminal phase signal
160 Signal combiner
162 Digital output signal
164 Pulse center of a pulse in the output signal
166 Target phase position
168 Target pulse with unpermitted pulse width
169 Output pulse with permitted minimal pulse width
170 Power amplifier
180 Reconstruction filter
190 Transmission arrangement
200 Mapper
201 First thermometer encoder
202 Second thermometer encoder
203 Plurality of AND gates
204 Plurality of inverters
210 Plurality of mapper output signals
220 Output multiplexer
1000 Device with a multiphase clock signal generator
2000 Device with mappers
SM1 First state machine
SM2 Second state machine
Reg1 First register
Reg2 Second register
Mux1 First multiplexer
Mux2 Second multiplexer

VARIABLES

M Number of second start phase words/Number of second terminal phase words
N Number of discrete clock phases in the digital output signal 162/Number of phase-shifted clock signals and clock phases
n Second resolution
a First resolution
$\phi_{P1}$ Start phase word
$\phi_{P2}$ Terminal phase position
$\phi_1 \ldots \phi_N$ Available discrete phase positions in the multiphase clock signal
A Input signal in the form of a digital baseband signal representing an amplitude
$\phi$ Input signal in the form of a digital baseband signal representing a phase

The invention claimed is:

1. A device (1000; 2000) for encoding an input signal (102) into a digital pulse-width and/or phase modulated output signal (162), said signal being referred to hereinafter as a digital output signal (162), said device comprising:
an input for receiving the input signal (102) and an output for outputting the digital output signal (162),
a phase encoder (100) configured to derive a binary first start phase word (104) and a binary first terminal phase word (106) with a first resolution from the input signal (102), wherein
the first start phase word (104) determines a starting time within an encoding period, at which a rising edge of a target pulse (108) is to occur in the digital output signal (162), and the first terminal phase word (106) determines a termination point within the encoding period, at which a falling edge of the target pulse (108) is to occur in the digital output signal (162),
a phase interpolator (110) connected downstream from the phase encoder (100) and configured to convert the first start phase word (104) into a plurality of second binary start phase words (114.1 . . . M) and the first terminal phase word (106) into a plurality of second binary terminal phase words (116.1 . . . M), with a second resolution that is smaller than the first resolution,
wherein a respective second start phase word describes one of N possible discrete times in the encoding period and thus approximately determines the starting time with the second resolution, and a respective second terminal phase word describes one of the N possible discrete times in the encoding period and thus approximately determines the termination point with the second resolution, and
an output signal generator (130, 140, 150, 160; 200, 220) configured to convert the plurality of second start phase words (114.1 . . . M) and the plurality of second terminal phase words (116.1 . . . M) into a serial sequence of output pulses and to output these as an output signal (162) via the output, the serial sequence of output pulses corresponding on average over time to the target pulse (108).

2. The device (1000) according to claim 1, in which the output signal generator (130, 140, 150, 160) is fed a reference clock signal (132) and the output signal generator (130, 140, 150, 160) comprises:
a multiphase clock signal generator (130) configured to derive a multiphase clock signal (134) from the reference clock signal (132), said reference clock signal (132) comprising a plurality of clock signals phase-shifted by discrete amounts of phase, the phase shift of said clock signals relative to the reference clock signal increasing, beginning at zero, by one phase shift from one clock signal to the next and,
a start phase multiplexer (140) and a terminal phase multiplexer (150), to the input side of each of which the multiphase clock signal (134) is supplied, wherein
the start phase multiplexer (140) is configured to switch one of the phase-shifted clock signals, as a start phase signal (144), through to its output according to the plurality of second start phase words (114.1 . . . M) and
the terminal phase multiplexer (150) is configured to switch one of the phase-shifted clock signals, as a terminal phase signal (156), through to its output according to the plurality of second terminal phase words (116.1 . . . M) and
a signal combiner (160) configured to combine the start phase signal (144) and the terminal phase signal (156) to form the digital output signal (162), by
making the start phase signal (144) trigger the rising edge of a respective output pulse in the output signal and making the terminal phase signal (156) trigger the falling edge of the respective output pulse.

3. The device (2000) according to claim 1, in which the output signal generator (200, 220) comprises:
a mapper (200) to which the plurality of second start phase words (114.1 . . . M) and the plurality of second terminal phase words (116.1 . . . M) are fed and which is configured to provide a plurality of mapper output signals (210) according to the plurality of second start phase words (114.1 . . . M) and the plurality of second terminal phase words (116.1 . . . M), wherein a respective one of the mapper output signals (210) forms a pulse whose pulse width and phase are determined by a respective word pair which is formed from a respective one of the plurality of second start phase words (114.1 . . . M) and a respective one of the plurality of second terminal phase words (116.1 . . . M), and an output multiplexer (220) configured to convert the plurality of mapper output signals into the digital output signal.

4. The device (1000; 2000) according to claim 1, in which the phase encoder (100) is operated at a phase encoder clock rate and/or the phase interpolator (110) is operated at a phase interpolator clock rate, and the output signal generator is operated at a output signal generator clock rate, the phase encoder clock rate and the phase interpolator clock rate each being lower by at least a factor of two than the output signal generator clock rate.

5. The device (1000; 2000) according to claim 1, in which the phase encoder (100) is configured to derive the first start phase word (104) and the first terminal phase word (106) in such a way that the time of the rising edge of a respective output pulse and the time of the falling edge of the respective output pulse are symmetrically varied with respect to a reference phase.

6. The device (1000; 2000) according to claim 1, in which the output signal generator (160, 130, 140, 150; 200, 210) is configured to produce an output pulse with a permitted minimal pulse width (169) in the digital output signal (162) and then to suppress any subsequent output pulse or to suppress any output pulse and then to produce an output pulse with a permitted minimal pulse width (169) in the digital output signal (162), if the pulse width of the target pulse (169) falls below a prohibited minimum.

7. The device (1000; 2000) according to claim 1, wherein the input signal (102) comprises an amplitude signal (102.1) and a phase signal (102.2).

8. The device (1000; 2000) according to claim 1, in which the phase interpolator (110) includes at least one delta sigma modulator for conversion purposes.

9. A power amplifier (170) having the device (1000; 2000) according to claim 1.

10. A transmission arrangement (190) having a device (1000; 2000) according to claim 1.

11. A method for encoding an input signal (102) into a digital pulse-width and/or phase modulated output signal (162), referred to hereinafter as a digital output signal (162), comprising the steps of:

receiving the input signal, deriving a binary first start phase word (104) and a binary first terminal phase word (106) from the input signal, with a first resolution, wherein the first start phase word (104) determines a starting time within an encoding period, at which a rising edge of a target pulse (108) is to occur in the digital output signal (162), and the first terminal phase word (106) determines a termination point within the encoding period, at which a falling edge of the target pulse (108) is to occur in the digital output signal (162), converting the first start phase word (104) into a plurality of second binary start phase words (114.1 . . . M) and the first terminal phase word (106) into a plurality of second binary terminal phase words (116.1 . . . M), with a second resolution that is smaller than the first resolution, wherein a respective second start phase word describes one of N possible discrete times in the encoding period and thus approximately determines the starting time with the second resolution, and a respective second terminal phase word describes one of the N possible discrete times in the encoding period and thus approximately determines the termination point with the second resolution, converting the plurality of second start phase words (114.1 . . . M) and the plurality of second terminal phase words (116.1 . . . M) into a serial sequence of output pulses, the serial sequence of output pulses corresponding on average over time to the target pulse (108), and outputting the serial sequence of output pulses as a digital output signal (162).

12. The method of claim 11, in which conversion includes:

providing a reference clock signal (132), deriving a multiphase clock signal (134) from the reference clock signal (132), the reference clock signal (132) comprising a plurality of clock signals phase-shifted by discrete amounts of phase, the phase shift of said clock signals relative to the reference clock signal increasing, beginning at zero, by one phase shift from one clock signal to the next, selecting a first of the plurality of clock signals (134) according to the plurality of second start phase words (114.1 . . . M) and providing the selected first clock signal as the start phase signal (144), selecting a second of the plurality of clock signals (134) according to the plurality of second terminal phase words (116.1 . . . M) and providing the selected second clock signal as the terminal phase signal (156), combining the start phase signal (144) and the terminal phase signal (156) to form the output signal (162), by making the start phase signal (144) trigger the rising edge of a respective output pulse in the digital output signal (162) and making the terminal phase signal (156) trigger the falling edge of the respective output pulse.

13. The method of claim 11, in which conversion includes:

generating a plurality of mapper output signals (210) according to the plurality of second start phase words (114.1 . . . M) and the plurality of second terminal phase words (116.1 . . . M) by means of a mapper (200), wherein a respective one of the mapper output signals (210) forms a pulse whose pulse width and phase are determined by a respective word pair which is formed from a respective one of the plurality of second start phase words (114.1 . . . M) and a respective one of the plurality of second terminal phase words (116.1 . . . M), and serially outputting the plurality of mapper output signals (210) as the digital output signal (162).

14. A method for transmitting a high-frequency output signal, wherein a low-frequency input signal (102) is transformed by a method according to claim 11 into the high-frequency digital pulse-width and/or phase modulated output signal (162) and then transmitted.

* * * * *